United States Patent
Chi et al.

(10) Patent No.: US 6,531,396 B1
(45) Date of Patent: Mar. 11, 2003

(54) METHOD OF FABRICATING A NICKEL/PLATINUM MONSILICIDE FILM

(75) Inventors: Dongzhi Chi, Singapore (SG); Syamal Kumar Lahiri, Singapore (SG); Dominique Mangelinck, Marseilles (FR)

(73) Assignee: Institute of Materials Research and Engineering (SG)

( * ) Notice: Subject to any disclaimer, the term of this patent is extended or adjusted under 35 U.S.C. 154(b) by 40 days.

(21) Appl. No.: 09/716,632

(22) Filed: Nov. 17, 2000

(30) Foreign Application Priority Data

Nov. 17, 1999  (SG) .............................................. 9905841

(51) Int. Cl.$^7$ .......................................... H01L 21/8238

(52) U.S. Cl. .................................................... 438/682

(58) Field of Search ................................ 438/682, 683, 438/664, 656, 649, 651, 655

(56) References Cited

U.S. PATENT DOCUMENTS

| | | | |
|---|---|---|---|
| 6,204,132 B1 * | 3/2001 | Kittl et al. .................. | 438/299 |
| 6,265,252 B1 * | 7/2001 | Lin ............................. | 438/197 |
| 2002/0045307 A1 * | 4/2002 | Kittl et al. .................. | 438/226 |

OTHER PUBLICATIONS

Chi, D.Z., et al., "Nickel–platinum alloy monosilicidation–induced defects in n–type silicon," *Applied Physics Letters*, vol. 76, No. 23 pp. 3385–3387 (2000).

Colgan, E.G., et al., "Formation and stability of silicides on polycrystalline silicon," *Materials Science and Engineering*, R16, 4 pgs. (1996).

"Estimation of allowable Ni and Pt concentrations," 2 pgs.

"Estimation of allowable Ni and Pt concentrations in silicon," 2 pgs.

Fair, R., ed., *Rapid Thermal Processing: Science and Technology*. Boston: Academic Press, Inc., pp. 1–11, 349–423 (1993).

Kitagawa, H., et al., "Electrical Properties of Nickel in Silicon," *Journal of Electronic Materials*, vol. 20, No. 6, pp. 441–447 (1991).

Tanaka, S., et al., "Majority–Carrier Capture Cross Section of Amphoteric Nickel Center in Silicon Studied by Isothermal Capacitance Transient Spectroscopy," *Jpn. J. Appl. Phys.*, vol. 35, pp. 4624–4625 (1996).

Rao, K., et al., "Identification of the nature of platinum related midgap state in silicon by deep level transient spectroscopy," *Journal of Applied Physics*, vol. 85, No. 4, pp. 2175–2178 (1999).

Sze, S.M., *Semiconductor Devices: Physics and Technology*, Singapore: Bell Telephone Laboratories, Inc., pp. 48–55 (1985).

*The National Technology Roadmap for Semiconductors: Technology Needs*, Singapore: Bell Telephone Laboratories, Inc., p. 65 (1985).

* cited by examiner

*Primary Examiner*—Richard Elms
*Assistant Examiner*—Beth E. Owens
(74) *Attorney, Agent, or Firm*—Ladas & Parry

(57) ABSTRACT

A method of fabricating a silicide layer on a silicon region of a semiconductor structure, the method comprising the steps of: providing a semiconductor structure having at least one silicon region on a surface thereof; depositing a layer comprising nickel and platinum on the at least one silicon layer; annealing the semiconductor structure and the nickel/platinum layer to react the nickel and the platinum with underlying silicon to form a nickel-platinum silicide, wherein annealing step takes place at temperature of between 680° C. and 720° C.

13 Claims, 6 Drawing Sheets

Temperature Dependence of Leakage Current of a Shottky Diode Fabricated on Ni(Pt) Silicided and Subsequently Etched-off Silicon Wafer (1 mm2)

METHOD OF FABRICATING A NICKEL/PLATINUM MONSILICIDE FILM

THIS INVENTION relates to a method of fabricating semiconductor structures and more particularly to a method of forming nickel-platinum monosilicide on a silicon semiconductor device.

Silicide processes are used in the manufacture of large-scale integrated silicon circuit devices to provide a silicide layer with low sheet resistance on a silicon semiconductor structure or device.

Typically, the surface of a silicon semiconductor or device is adjoined by regions of silicon and regions of insulating materials like silicon oxide, silicon nitride, silicon oxynitride and aluminium oxide. A film is deposited on the surface of the silicon semiconductor structure or device using conventional deposition techniques such as sputtering, electron-beam evaporation, or filament evaporation. The film can be deposited by sputtering an alloy target or by co-sputtering two or more pure targets. Once the film has been deposited on the silicon layer, the semiconductor device is annealed using a rapid thermal annealing process. The annealing process forms a silicide film in the silicon regions as a result of the reaction between the deposited film and the underlying silicon layer.

The most commonly used material for creating a silicide layer is titanium. The resultant titanium silicide layer (titanium disilicide) has a substantial drawback. That drawback is the high sheet resistance encountered when using narrow line widths. The increase in sheet resistance with decreasing line widths is due to the lack of the nucleation centres for the low resistive C54 phase during the phase transition from C49 phase to C54 phase.

The increase in sheet resistance as a result of decreasing line widths is not an issue for cobalt disilicide which is also used to form a silicide layer. However, cobalt disilicide suffers from other drawbacks such as a severe junction leakage current, a relatively large consumption of silicon and the difficulty of achieving a disilicide layer of uniform thickness. The use of cobalt disilicide in ultra-shallow junction devices would not, therefore, be appropriate.

Nickel monosilicide can also be used in the silicide process because it has a low electrical resistivity (in the order of 14 $\mu\Omega$ cm), a low consumption of silicon atoms and the ability to maintain low resistivity even for narrow line widths down to 0.1 $\mu$m. In addition, the use of nickel monosilicide allows the thickness of the silicide film to be determined more accurately because of the absence of any reaction between the nickel and the annealing ambient gas (typically nitrogen). There are problems with the use of nickel monosilicide because it is not thermally stable at relatively high processing temperatures. For example, agglomeration is observed at temperatures below 600° C. and transformation of monosilicide structures to disilicide structures with higher electrical resistivity was found below 700° C.

These problems can, however, be solved by adding small amounts of alloying elements such as platinum into the nickel. For example, the addition of 5% platinum into a nickel film layer can increase the disilicide nucleation temperature to 900° C. and the agglomeration temperature to 750° C. or above whilst the silicide resistivity remains almost the same as that of pure nickel monosilicide.

There is unfortunately also a drawback to the use of nickel-platinum monosilicides. When nickel-platinum monosilicides are applied to ultra large-scale integrated circuits, the formation of nickel and platinum related defects is noted. The formation of these defects is inevitable because both nickel and platinum have relatively high solubility in silicon and diffuse very quickly, even at relatively low temperatures. The formation of electrically active defects from the nickel and platinum establishes recombination and generation centres which have a detrimental effect on the performance of the resultant semiconductor devices. For example, the leakage currents through p/n junctions of source/drain regions of a field effect transistor can become unacceptably high if the formation of the nickel and platinum related defects is not controlled.

It is an object of the present inventions to provide a method of fabricating a nickel-platinum monosilicide on a silicon semiconductor whilst controlling the formation of nickel and platinum related defects to an acceptable level.

It is a further object of the present invention to provide a method of fabricating a nickel-platinum monosilicide on a semiconductor structure to produce a semiconductor device having a low leakage current.

Accordingly, one aspect of the present invention provides a method of fabricating a silicide layer on a silicon region of a semiconductor structure, the method comprising the steps of: providing a semiconductor structure having at least one silicon region on a surface thereof; depositing a layer of nickel and platinum on the at least one silicon region; annealing the semiconductor structure and the nickel/platinum layer to react the nickel and the platinum with underlying silicon to form a nickel-platinum silicide, wherein the annealing step takes place at temperature of between 680° C. and 720° C.

Advantageously, the annealing temperature is 700° C.

Preferably, the nickel/platinum layer is deposited by sputtering a nickel/platinum alloy target.

Alternatively, the nickel/platinum layer is deposited by co-sputtering a pure nickel target and a pure platinum target.

Further, in the alternative, the nickel/platinum layer is deposited by the sequential deposition of nickel and platinum.

Conveniently, any excess nickel/platinum which has not reacted with the silicon region is removed from the semiconductor device.

Advantageously, the nickel/platinum layer has a nickel content of between 90 and 99% and a platinum content of between 1 and 10%.

Preferably, the nickel content is 95% and the platinum content is 5%.

Conveniently, the annealing atmosphere is a nitrogen atmosphere or an argon atmosphere.

Alternatively, the annealing step occurs in a vacuum.

Another aspect of the present invention provides a semiconductor structure having a silicon region and a nickel-platinum silicide layer formed thereon, the silicide layer having been formed by annealing the semiconductor structure coated with a layer of nickel and platinum to react the nickel and the platinum with underlying silicon, wherein the annealing temperature is between 680° C. and 720° C.

In order that the present invention may be more readily understood, embodiments thereof will now be described, by way of example, with reference to the accompanying drawings, in which.

The primary aim of the present invention is to minimise the formation of electrically active defects within a semiconductor device caused by the formation of a nickel-platinum monosilicide layer on a silicon wafer.

A nickel-platinum alloy film is deposited on the surface of a silicon semiconductor structure using conventional deposition techniques such as sputtering, electron-beam evaporation, or filament evaporation. If the sputtering method is used, then the nickel-platinum alloy film can be deposited by sputtering nickel-platinum alloy target or by co-sputtering a pure nickel target and a pure platinum target. Alternatively, the layers can be deposited sequentially, with either the nickel or the platinum layer being deposited first. The resultant nickel/platinum layer has a nickel content of between 90 and 99% and a platinum content of between 1 and 10%. A 5% platinum content is preferred.

After the deposition step, the silicon semiconductor structure is subjected to high temperature rapid thermal annealing to form a nickel-platinum monosilicide on selected regions of the silicon semiconductor structure. If there are insulating materials adjoining the regions, then no silicide film is formed on these regions.

It has been found that by controlling the annealing step such that annealing takes place at a critical temperature range of between 680° C. and 720° C., the formation of electrically active defects can be minimised and reduced to an acceptable level. The acceptable level for the formation of nickel related defects and platinum related defects estimated from the SIA Road Map ("National Technology Road Map for Semiconductors", Semiconductor Industry Association 1997) are below $1\times10^{14}$ defects/cm$^3$ and $2\times10^{13}$ defects/cm$^3$ respectively. An annealing temperature range of between 690° C. and 710° C. is preferred. Typically, the annealing process will take in the region of 10 to 60 seconds and it is necessary to control the annealing temperature within the above indicated range during this period.

Figure 1:
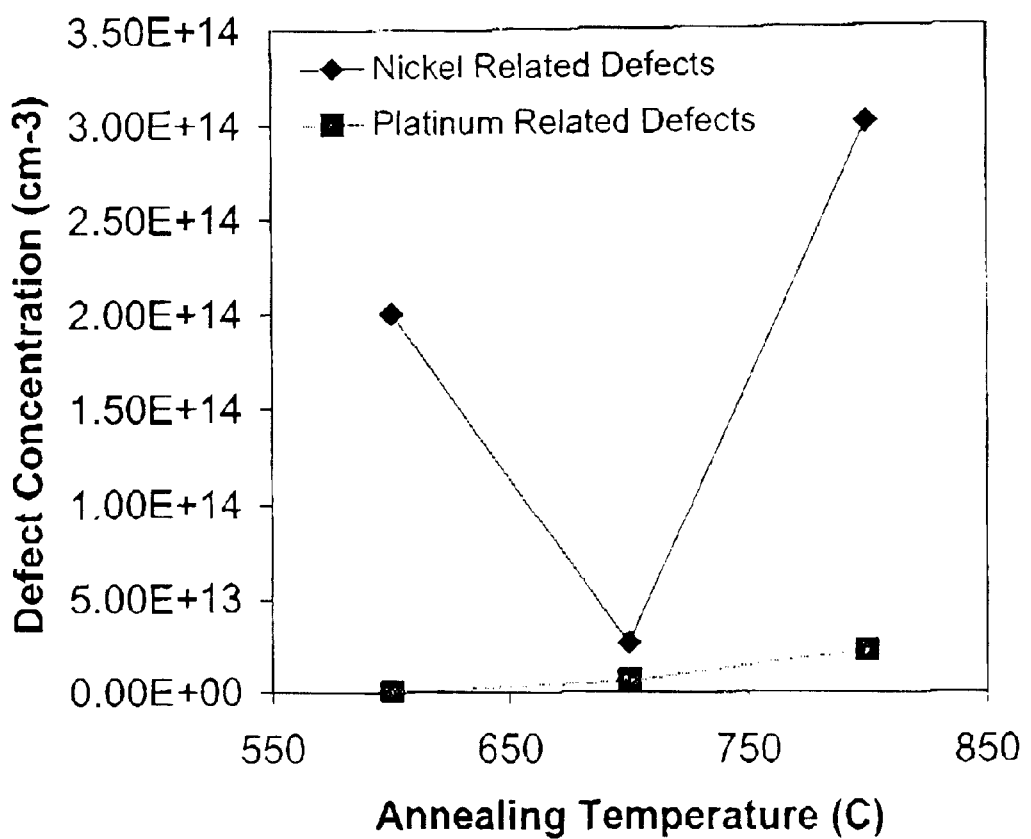
FIG. 1 is a graph showing the concentration of mid-gap defects induced by nickel platinum monosilicide formation against annealing temperature.

It has been found that below 680° C., a higher concentration of nickel related defects including extended defects form in the near surface region of the silicon zone. Above 720° C., a high concentration of platinum related mid-gap type defects form in the near surface region of the silicon zone, in addition to the formation of high concentration nickel related defects. Also, above 720° C., there is a significant increase in the resistivity of the monosilicide film. The increase in nickel and platinum related defects is illustrated graphically in FIG. 1.

Figure 2:
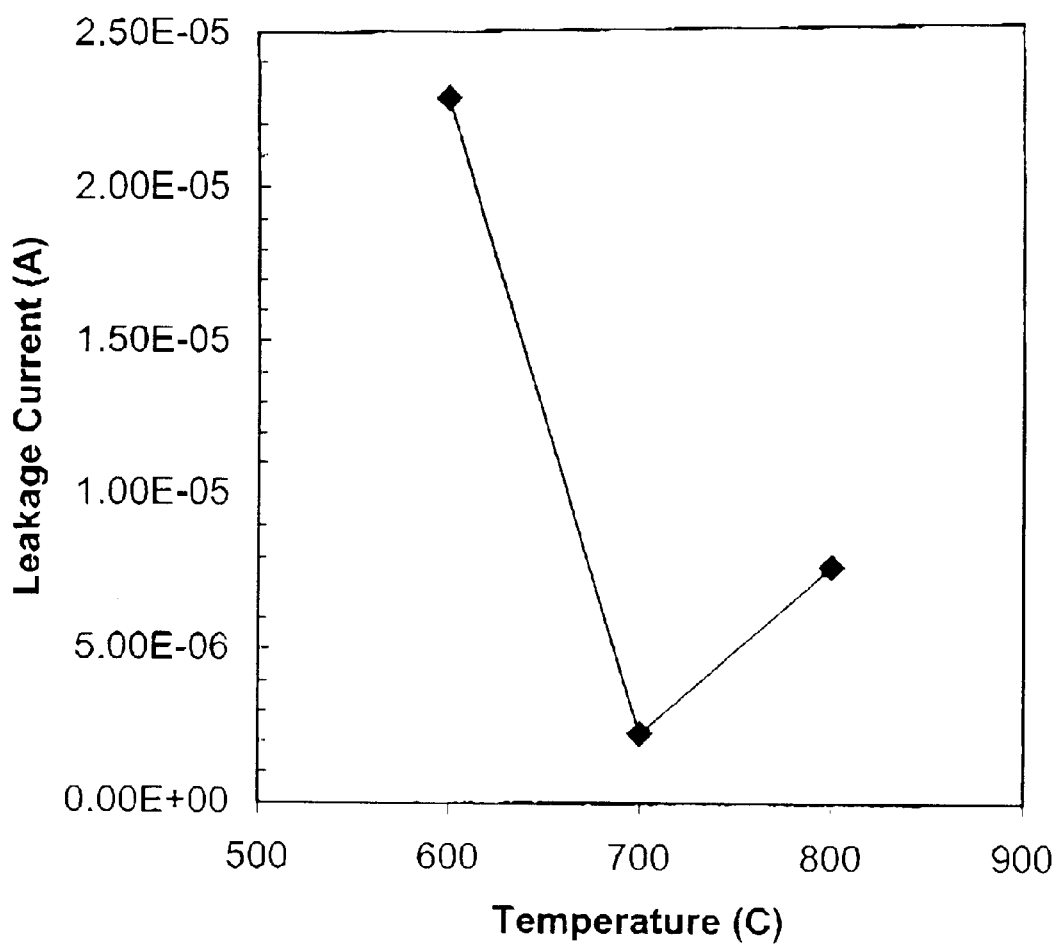
FIG. 2 is a graph showing leakage current against temperature.

An increase in the leakage current of a resultant semiconductor device provided with a nickel-platinum monosilicide layer is also observed when annealing is carried out outside the critical temperature range identified as lying between about 680° C. and 720° C. This is illustrated graphically in FIG. 2. Specifically, FIG. 2 shows the temperature dependence of the reverse leakage current of a Schottky diode of 1 mm$^2$ area fabricated on a nickel-platinum monosilicided silicon wafer.

This surprising minimisation of nickel and platinum related defects is particularly important for ultra large scale integrated circuits devices (sub 0.15 µm devices), particularly those using shallow (<0.1 µm) or ultra-shallow (<600 Å) junctions.

High temperature rapid thermal annealing is a conventional form of annealing which is described in "Rapid Thermal Processing, Science and Technology", edited by Richard B. Fair, Academic Press (1993).

A specific example of a method of fabricating a silicide layer on silicon regions of a semiconductor structure embodying the present invention is described below.

EXAMPLE

Figure 3:
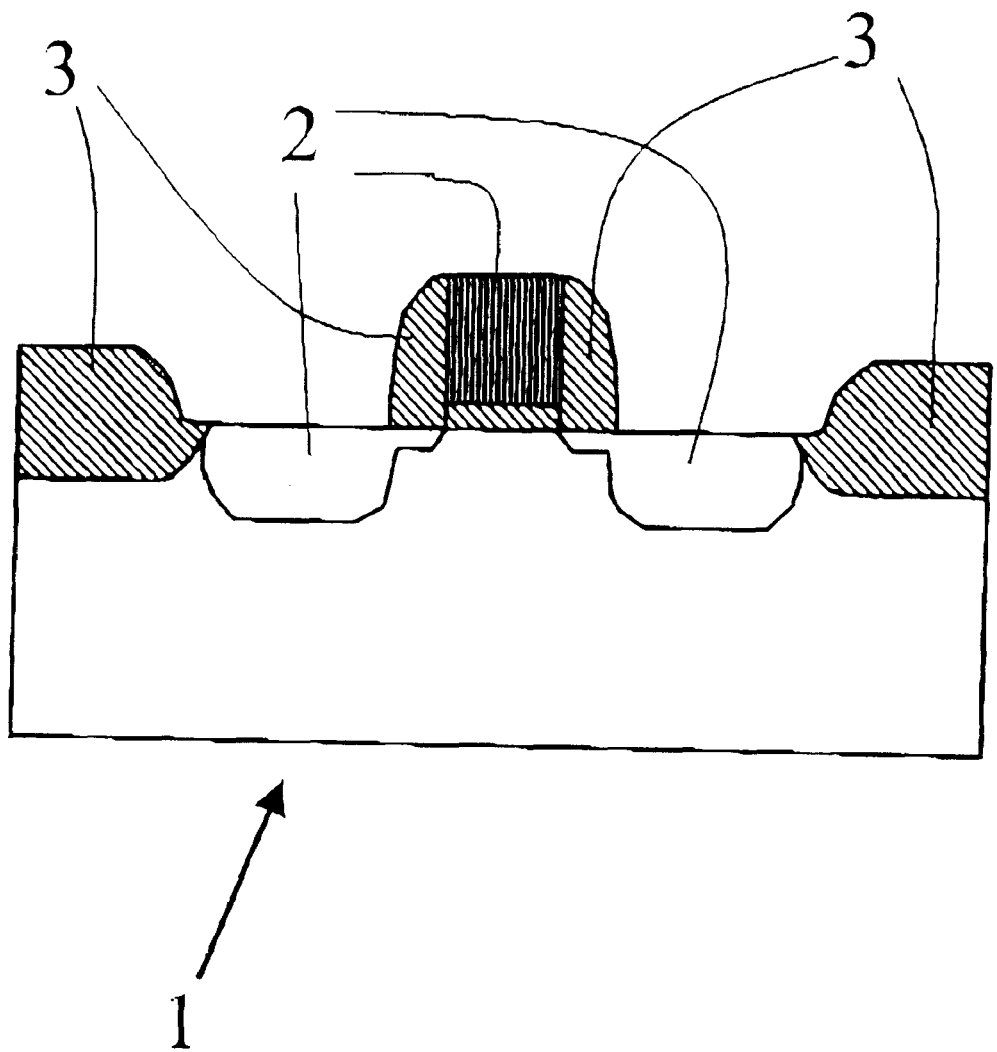
FIG. 3 is a cross-section through a semiconductor structure before film deposition.
Figure 4:
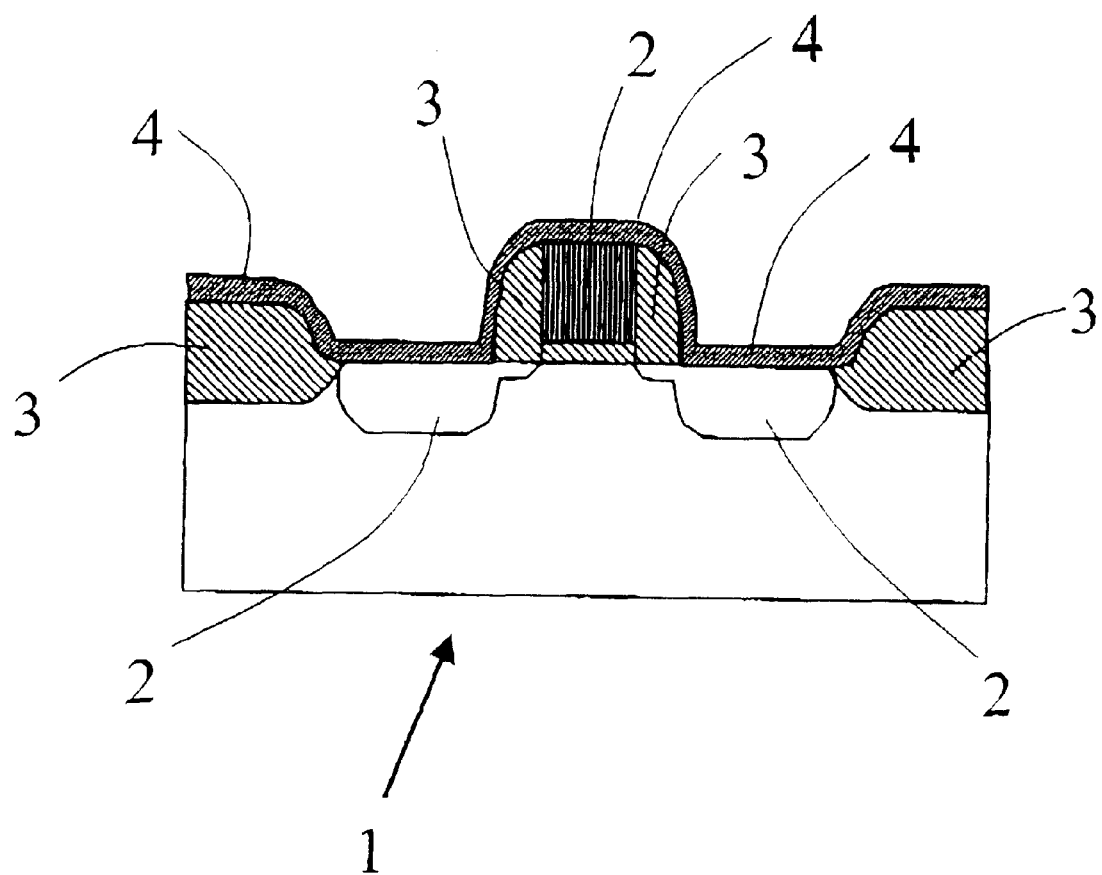
FIG. 4 is a cross-section through the semiconductor structure of FIG. 3 after film deposition.

Referring to FIG. 3, a silicon semiconductor structure 1 comprises, inter alia, a surface having silicon regions 2 (i.e. source/drain regions) and adjacent insulating regions 3. Turning now to FIG. 4, a layer comprising nickel and platinum is deposited as a blanket film 4 over the silicon regions 2 and the adjacent insulating regions 3 of the silicon semiconductor structure, using a conventional deposition process. The resultant nickel/platinum layer 4 has a 95% nickel content and a 5% platinum content. The film 4 may include other elements such as, for example, titanium.

Figure 5:
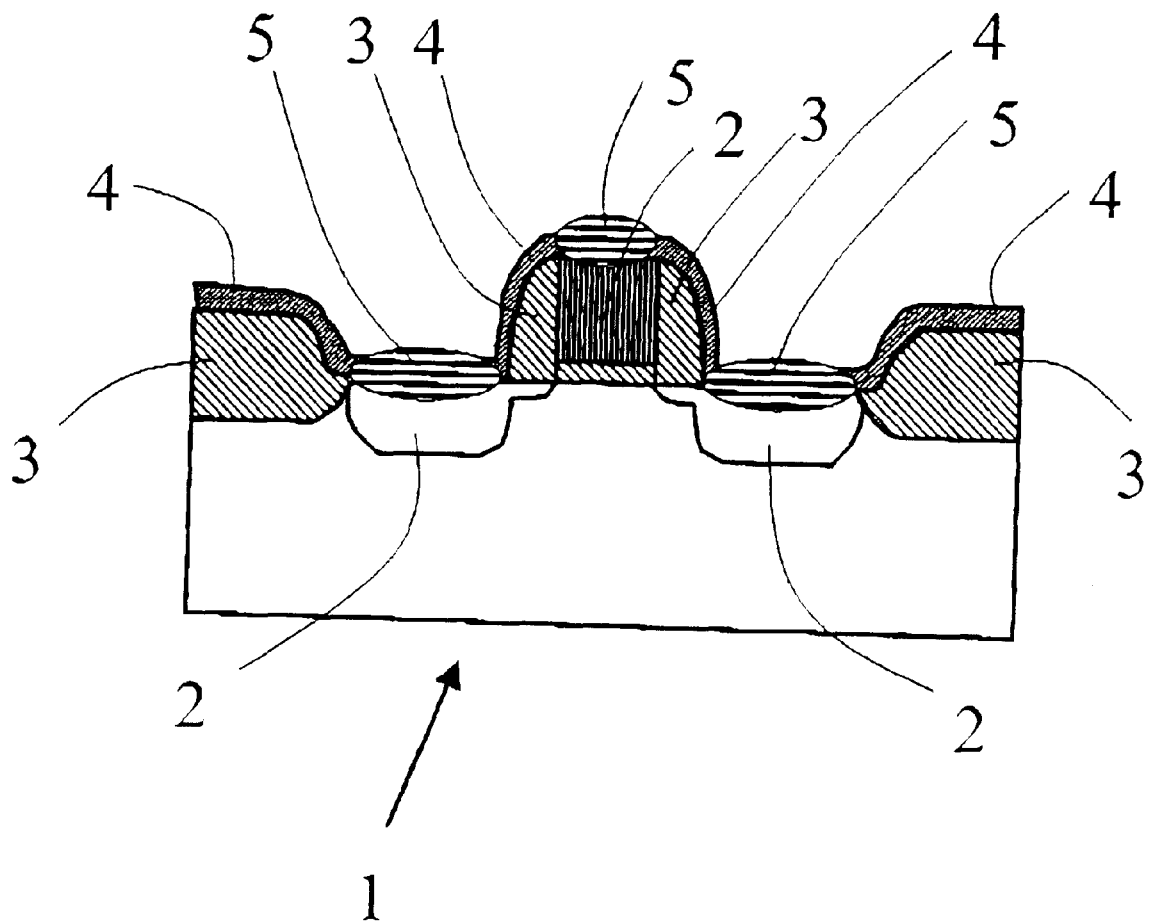
FIG. 5 is a cross-section through the semiconductor structure of FIG. 4 after annealing in accordance with all embodiment of the present invention.

The silicon semiconductor structure 1 and the nickel/platinum layer 4 are then subjected to high temperature rapid thermal annealing to form a nickel-platinum monosilicide 5 on the silicon regions 2 as shown in FIG. 5. The annealing takes place in a nitrogen atmosphere at a temperature of 700° C. The annealing process takes 60 seconds.

Figure 6:
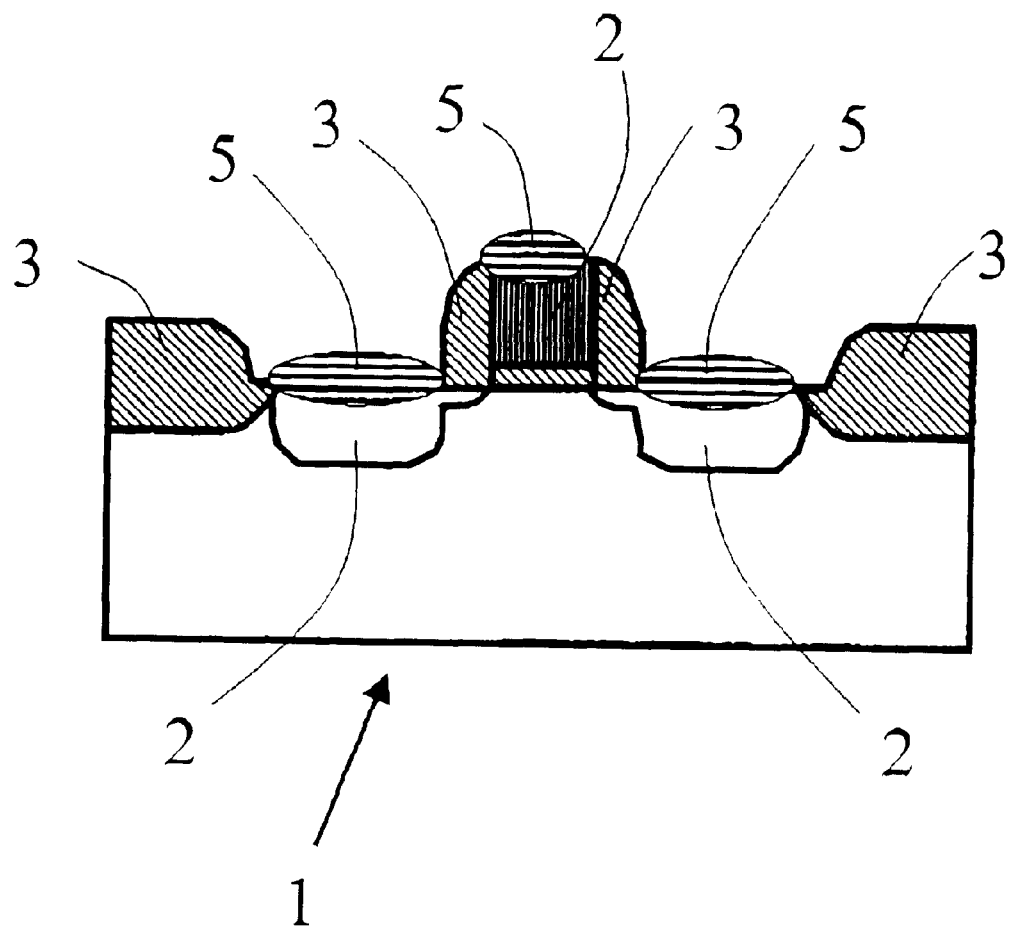
FIG. 6 is a cross-section through the semiconductor structure of FIG. 5 after removal of unreacted film.

After annealing, any excess nickel/platinum film 4 on top of the insulating regions 3 of the semiconductor structure 1 which has not reacted with the silicon regions 2 is removed, as shown in FIG. 6, using appropriate chemicals without etching the monosilicide film 5 formed on top of the silicon regions 2 in accordance with methods for removing nickel/platinum films well known to those of ordinary skill in the art.

The resultant semiconductor structure has a low defect concentration (i.e. below $1\times10^{14}$ defects/cm$^3$ for nickel related defects and $2\times10^{13}$ defects/cm$^3$ for platinum related defects and a low leakage current.

In the present specification "comprise" means "includes or consists of" and "comprising" means "including or consisting of".

The features disclosed in the foregoing description, or the following claims, or the accompanying drawings, expressed in their specific forms or in terms of a means for performing the disclosed function, or a method or process for attaining the disclosed result, as appropriate, may, separately, or in any combination of such features, be utilised for realising the invention in diverse forms thereof.

What is claimed is:

1. A method of fabricating a silicide layer on a silicon region of a semiconductor structure, the method comprising the steps of:

providing a semiconductor structure having at least one silicon region on a surface thereof;

depositing a layer comprising nickel and platinum on the at least one silicon region;

annealing the semiconductor structure and the nickel/platinum layer to react the nickel and the platinum with underlying silicon to form a nickel-platinum silicide, wherein the annealing step takes place at a temperature of between 680° C. and 720° C.

2. A method according to claim 1, wherein the annealing temperature is 700° C.

3. A method according to claim 1, wherein the nickel/platinum layer is deposited by sputtering a nickel/platinum alloy target.

4. A method according to claim 1, wherein the nickel/platinum layer is deposited by co-sputtering a pure nickel target and a pure platinum target.

5. A method according to claim 1, wherein the nickel/platinum layer is deposited by a sequential deposition of nickel and platinum.

6. A method according to claim 1, wherein any excess nickel/platinum which has not reacted with the at least one silicon region is removed from the semiconductor structure.

7. A method according to claim 1, wherein the nickel/platinum layer has a nickel content of between 90 and 99% and a platinum content of between 1 and 10%.

8. A method according to claim 7, wherein the nickel content is 95% and the platinum content is 5%.

9. A method according to claim 1, wherein the annealing atmosphere is a nitrogen atmosphere or an argon atmosphere.

10. A method according to claim 1, wherein the annealing step occurs in a vacuum.

11. A method according to claim 1, wherein the nickel-platinum silicide is a single-layer nickel-titanium alloy silicide.

12. A semiconductor structure having a silicon region and a nickel-platinum silicide layer formed thereon, the silicide layer having been formed by annealing the semiconductor structure coated with a layer comprising nickel and platinum to react the nickel and the platinum with underlying silicon, wherein the annealing temperature is between 680° C. and 720° C.

13. A semiconductor structure according to claim 12, having a silicon region and a nickel-platinum silicide layer formed thereon, the silicide layer having nickel and platinum related defects therein, the defect concentration being below $1 \times 10^{14}$ defects/cm$^3$ for nickel related defects and $2 \times 10^{13}$ defects/cm$^3$ for platinum related defects.

* * * * *